United States Patent [19]

Hayes et al.

[11] Patent Number: 5,703,757
[45] Date of Patent: Dec. 30, 1997

[54] ELECTRONIC VEHICULAR JUNCTION BOX HAVING REDUCED SIZE AND WEIGHT

[75] Inventors: Earl J. Hayes, Northville; Timothy A. Hutchinson, Madison Heights; David A. Hein, Sterling Heights; Alexander Shen, Dearborn; Michael J. Pike-Biegunski, Milford, all of Mich.

[73] Assignee: Alcoa Fujikura Limited, Brentwood, Tenn.

[21] Appl. No.: 594,965

[22] Filed: Jan. 31, 1996

[51] Int. Cl.⁶ .................................................. H05K 5/00
[52] U.S. Cl. ........................ 361/752; 174/52.1; 439/76.2
[58] Field of Search ............................ 174/52.1, 71 B, 174/88 B, 99 B; 439/883, 76.1, 76.2; 361/752

[56] References Cited

U.S. PATENT DOCUMENTS

| | | | |
|---|---|---|---|
| 4,360,411 | 11/1982 | Ladet et al. | 204/33 |
| 5,229,922 | 7/1993 | Muramatsu et al. | 439/76 |
| 5,295,842 | 3/1994 | Ozaki et al. | 361/395 |
| 5,327,643 | 7/1994 | Sakamoto et al. | 29/830 |

*Primary Examiner*—Kristine L. Kincaid
*Assistant Examiner*—Hung V. Ngo
*Attorney, Agent, or Firm*—Elroy Strickland; Tracey D. Beiriger

[57] ABSTRACT

A junction box for motor vehicles in which first and second housing portions are provided for receiving and containing, respectively, low and high electrical current circuitboards. The housing portions extend in a generally common plane when connected together to form a housing unit. A planar insulating panel member containing buses and integral insulation displacement terminals are located between the housing portions and in a plane generally perpendicular to the common plane of the housing portions. The first and second housing portions are abutted and fastened together on opposed sides of the panel member with the buses and integral insulation displacement terminals. The insulation displacement terminals are effective to directly receive insulated wires of an electrical harness and electrically connect the same to the buses and to circuits of and electrical components associated with the circuitboards.

2 Claims, 2 Drawing Sheets

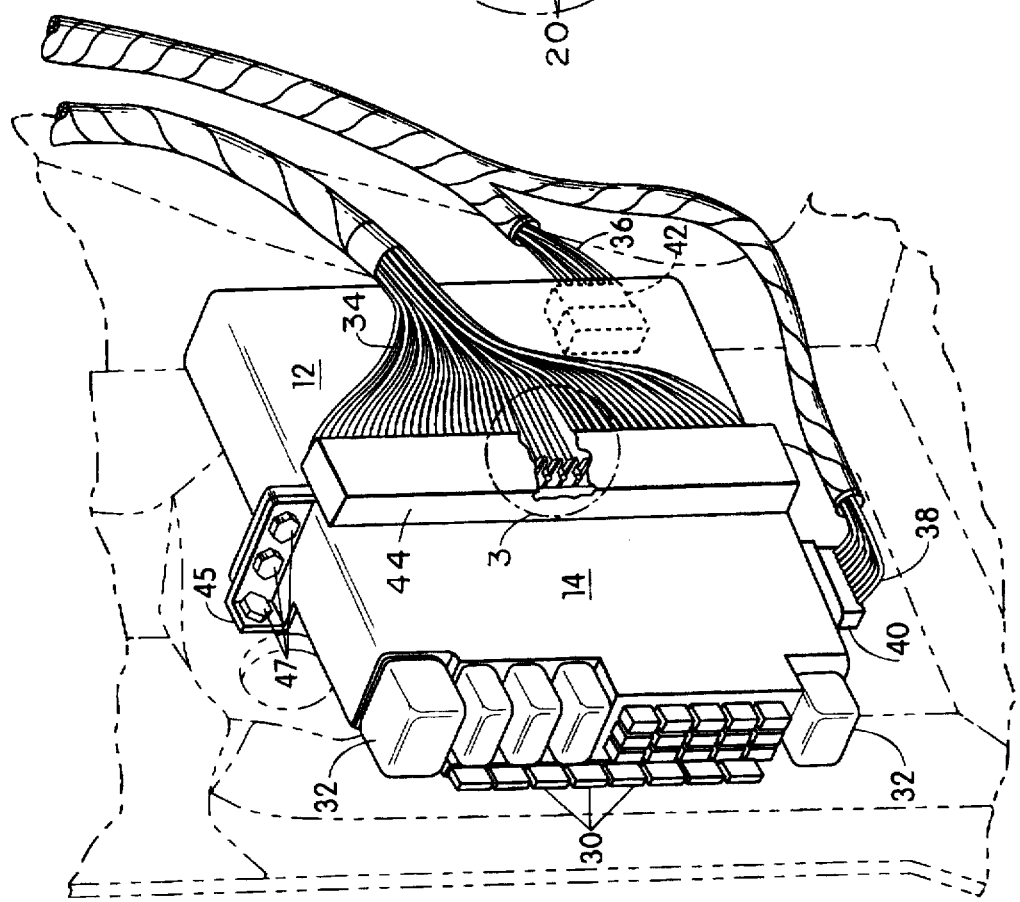

ELECTRONIC VEHICULAR JUNCTION BOX HAVING REDUCED SIZE AND WEIGHT

BACKGROUND OF THE INVENTION

The present invention relates generally to electrical junction boxes for motor vehicles, and particularly to junction boxes having a number of advantages over those presently available, as discussed below.

Junction boxes electrically connect plug-in components, such as fuses, relays and diodes, to wire harnesses by a series of electrical connectors and circuits located internally of the box. The internal circuitry typically comprises stamped and formed metal strips called "frets" that are placed on flat boards made of insulating materials. The stamped frets or strips are held in place by being located in corresponding recesses provided in the board surfaces and held in place by cold staking or heat staking nibs provided on the board surfaces.

This method of manufacturing the circuits does not allow for locating electronic components on the boards. And, due to the higher component content required for modern automotive applications, packaging a junction box within allotted space is becoming increasingly complex. In addition, modifying the box design by changing the component content requires new expensive tooling to make circuit changes to the new boards. Further, as complexity increases, the frets become longer and more complex, thereby increasing circuit path lengths and reducing electrical efficiency in current conduction from the harness to plug-in components and vice versa.

SUMMARY OF THE INVENTION

The present invention, inter alia, separates internal box circuitry into high and low current circuit locations. The high current circuits, which are handled via the conventional stamped metal fret technology, using one or both sides of one or more parallel insulating boards, can be slid into slots molded into a half housing section of a junction box. Low current circuitry is contained on a standard FR4 printed circuitboard material (PCB) separate from the fret boards, and is housed in another half portion of the box housing. The two housing halves are then brought together in a common plane and fastened about opposed faces of an upstanding bus panel. The bus panel is located vertically between the two housing halves when the two halves are joined together about the panel.

The bus panel is an insulating molded component containing an array of side-by-side bus strips and female terminals mechanically fastened to the bus strips. The arrangement of the female terminals on the bus strips of the panel determines circuit geometry for a given box, i.e., circuit geometry can be changed by relocating the placement of the terminals on the bus strips.

The junction box is permanently attached to major wire harnesses by a plurality of insulation-displacement-crimp (IDC) terminals integrally provided at least at one end of the bus strips. This method of attachment reduces by 50% the number of electrical interfaces over that of prior art boxes using electrical connectors to connect the ends of harness wires to components and circuitry within the box, i.e., the old way employed bus to terminal to wire interfaces whereas, in the present disclosure, the connection is from bus to wire directly. Connector terminals are eliminated.

In addition, the package size of the junction box of the invention is reduced by having all connections to and from the circuitboards made in planes parallel to the planes of the boards and in line with the stamped frets and printed circuits.

By such a parallel, in-line orientation, there is no need to bend the fret conductors for perpendicular connections. This (1) reduces manufacturing costs of the frets, (2) minimizes the overall size of the housing unit, and (3) shortens circuit paths for increased current handling efficiency, as bent frets are typically longer than planar frets.

By separating low current circuitboards from high current fret boards, electronics can be permanently incorporated on the circuitboards and located within a housing unit. In addition, the separation of high current circuits from low current circuits minimizes high current noise and interference with low current signals handled by the low current board.

Further, the low current printed circuitboard can be reprogrammed or exchanged without interfering with the power fret boards, and circuit geometry within the housing can be changed without incurring retooling costs by simply relocating connections on the vertical buses. Similarly, individual fret boards can be substituted without affecting other fret boards or the low current circuitboard.

Also, integral insulation displacement bus termination of major harness connections reduces further the overall size of the box assembly, as it eliminates a large connector that was employed to interface the junction box and the major wire harness.

Power frets are typically stamped from a brass or copper alloy. Copper frets offer superior electrical performance but add substantially to the cost of each junction box made, while brass frets are generally more cost effective but require greater size, as brass has reduced electrical conductance, thereby increasing the weight and size of the junction box. The objective is to reduce cost, weight and size (all three). Instead of the brass or copper alloy frets, the frets in the subject invention can be made from tin-plated aluminum alloy, such as 6061-T6. Tin plating is used to prevent the formation of electrically insulative oxides on the surface of the aluminum. Such coated frets provide a substantial weight reduction over either brass or copper, and compared to copper, aluminum frets provide a 40% cost reduction and 50% increase in current carrying capability over that of brass.

THE DRAWINGS

The invention, along with its objectives and advantages, will be better understood from consideration of the following detailed description and the accompanying drawings in which:

FIG. 2 is an isometric view of the junction box of FIG. 1 assembled together and mounted on a surface of a motor vehicle.

FIG. 3 is an exploded view of the displacement terminal of FIG. 2.

PREFERRED EMBODIMENT

Figures 1, 1A:
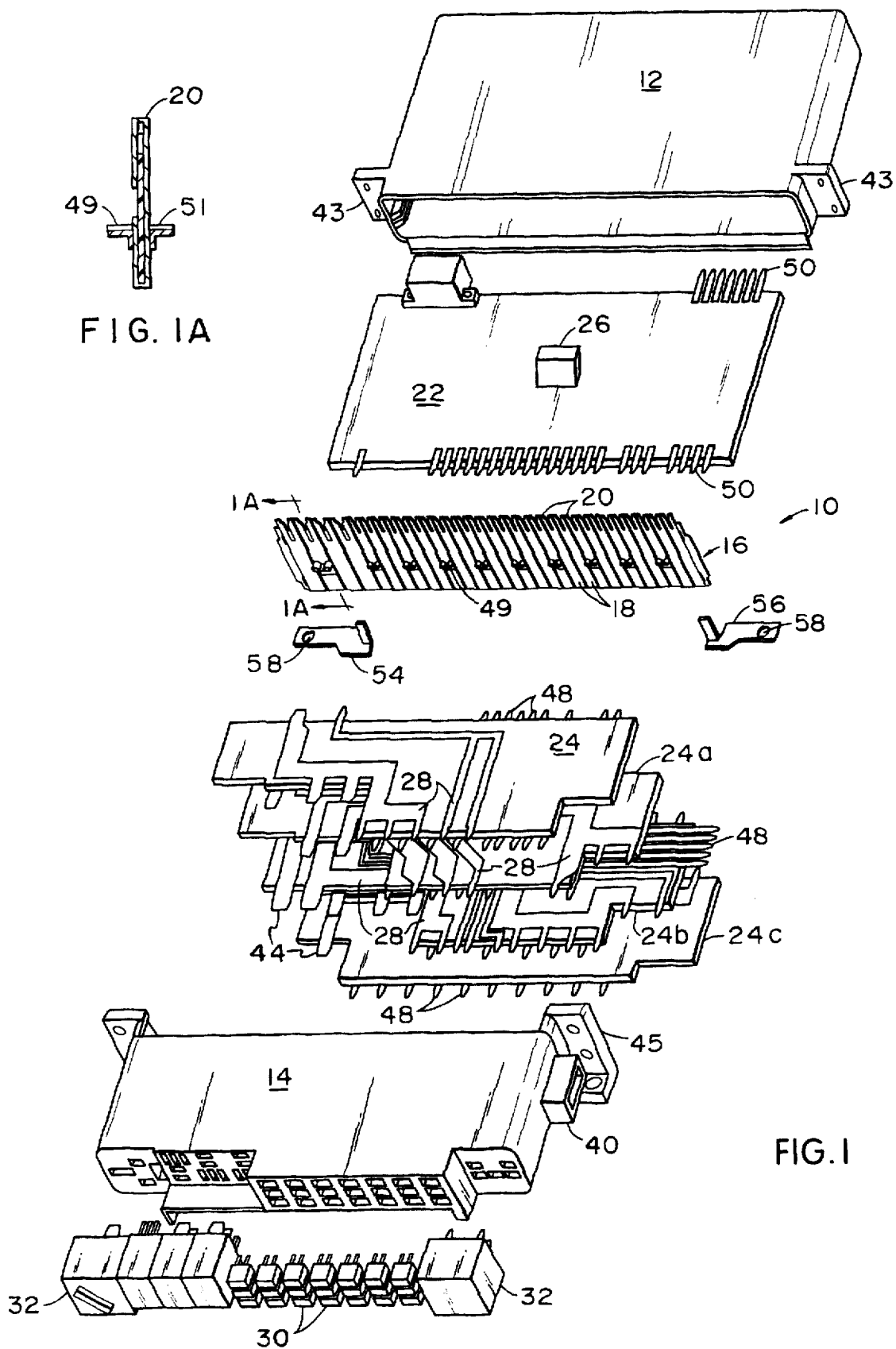
FIG. 1 is an exploded isometric view of certain components of the junction box of the invention.
FIG. 1A is a sectional view through a vertical bus panel in FIG. 1.

Referring now to the drawings, FIG. 1 thereof shows the junction box 10 of the invention in separated, exploded form to better view the component parts thereof and assess their relationship when assembled. More particularly, junction box 10, as a unit, comprises two housing portions or halves 12 and 14 disposed on opposite sides of an upstanding vertical panel member 16 containing a plurality of side-by-side bus conductors 18 (hereinafter "buses") terminating in integral insulation displacement terminals 20 located along the upper edge of the panel member. The panel member itself (16) is an electrically insulating molded plastic substrate on which the buses 18 are disposed and fixed. The buses are located on both sides of the substrate and suitably fixed thereto.

On opposite sides of the vertical panel 16 and buses 18 are located two horizontal circuitboards 22 and 24, respectively. Permanently mounted on board 22 are low current devices 26 (only one of which is shown), such as solid state relays, while board 24 contains stamped metal frets 28 for conducting high currents to fuses 30 and relays 32, sometimes referred to as ISO (International Standards Organization) relays from a main harness 34 (FIG. 2) connected to insulation displacement terminals 20. Low current circuitboard 22 has circuits (not shown) printed thereon, which connect low current devices, such as 26, to vertical buses 18 and to insulated harness wires 34. Additional, relatively small harnesses 36 and 38 are shown in FIG. 2 connected to junction box 10 via connectors 42 and 40, respectively.

Harness 34 is the main instrument panel harness of a vehicle, the insulated wire ends of which are directly connected to vertical buses 18 when their insulation is displaced by the insulation displacement terminals 20 of the buses. As shown in FIG. 2, a cover structure 44 encloses the ends of wires 34 and the insulation displacement terminals 20 after the housing halves 12 and 14 are brought and secured together via integral flanges 43, 45 of the housing halves and suitable fasteners 47. Harnesses 36 and 38 serve other electrical loads in the vehicle such as miscellaneous lights.

Fret board 24, as shown in FIG. 1, includes several such boards 24a through c located one above the other. The frets on each board terminate at the edges of the boards in integral male blades 48 located in the planes of the frets and parallel to the planes of the boards. The male blades connect to fuses 30 and relays 32, via female-to-female terminals (not visible) located in housing half 14, to harness wires 38 via connector 40, and to female terminals 49 (only every third one shown in FIG. 1 for clarity) suitably mounted on and electrically connected to respective vertical buses 18.

Similarly, the printed circuits on board 22 terminate in male blade terminals 50, which, in FIG. 1, are located along two opposed edges of the board. The blades are sized to enter female terminals 51, visible in FIG. 1A only, mounted on and electrically connected to respective vertical buses 18 on the side of vertical board 16 facing horizontal board 22. The vertical buses are thus effective in making electrical connections between the two circuitboards 22 and 24, including boards 24a through c, and between the boards and main harness 34 via integral terminals 20 of the vertical buses. As mentioned earlier, housing half 14 can be provided with slotted sidewalls to accommodate and retain in spaced relation boards 24 and 24a through c. Housing half 12 is provided with a height sufficient to accommodate electronic components such as 26 mounted on board 22.

Connector 42 is located at the rear of housing half 12 (FIG. 2). The connector has female terminals (not visible in the figures) attached to the ends of wires 36 for receiving the blades 50 at the rear of board 22 (FIG. 1). Similarly, on the bottom of housing 14 is connector 40 that contains female terminals (not visible) secured to the ends of respective harness wires 38 for receiving the blade terminals 48 on the right side of board 24b (FIG. 1).

Vertical buses 18, with their integral, insulation displacement terminals 20, eliminate a large connector and provides connection to the fret circuits and components associated with the printed circuitboards of FIG. 1. In the case of the connections made through female terminals 49 and 51, these connections use a high normal force design that minimizes constriction resistance (between one half of the electrical interface to the other half) and stabilizes changes in resistance caused by environmental conditions and load cycling.

In addition, the location of terminals 49 and 51 on buses 18 conveniently determines circuit geometry within box 10, i.e., circuit geometry can be changed by the changing buses to which terminals 49 and 51 are attached. Such an arrangement is highly flexible in altering circuit configurations within a given box 10.

Similarly, one fret board can be changed without affecting the other boards, and the low current, signal board 22 can be changed without affecting the fret boards. Also, the separation of the high current boards 24 from the signal board 22 minimizes interference and noise in the information handle by the signal board.

And, lastly, all connections to fret and signal board terminals 48 and 50 are made parallel to the planes of boards and fret layers such that no conductors need to be bent for connections perpendicular to the boards. This reduces manufacturing costs, minimizes the size (thickness) of the junction box unit and shortens circuit paths for electrical efficiency.

Two brackets 54 and 56 are shown in FIG. 1 for mounting respectively on two vertical buses 18 and electrically grounding the two buses. The two brackets are connected to vehicle sheet metal via fasteners (not shown) extending through holes 58 provided in the brackets.

Preferably, frets 28 with terminals 48 located on boards 24 and 24a to c are strips of tin-plated aluminum alloy, such as 6061-T6. The aluminum alloy reduces the weight of the board over that of copper and brass frets by thirty percent, and a forty percent reduction in cost over copper. In comparison to brass, the aluminum frets provide a fifty percent increase in electrical conductivity over brass frets. The tin plate on the aluminum maintains electrical conductivity between the aluminum and components connected thereto, as bare aluminum surfaces oxidize to form a hard, electrically insulative surface.

Weight-wise, junction boxes 10 using the tin-plated aluminum frets 28 were 500 grams lighter than boxes using C11000 copper frets.

What is claimed is:

1. A junction box for motor vehicles, comprising: first and second housing portions for receiving and containing respectively low and high electrical current circuitboards, said circuit boards extended parallel to a generally common plane, said housing portions extending in said common plane when connected together to form a housing unit in said plane, and a planar insulating panel member containing buses and integral, insulation displacement terminals, said planar panel being located between the housing portions in a plane generally perpendicular to the common plane of the housing portions and unit for directly receiving insulated wires of an electrical harness to electrically connect the same to said buses and to the circuits of electrical components associated with said circuitboards, said first and second housing portions being abutted and fastened together on opposed sides of the planar panel member.

2. The junction box of claim 1 in which the low current circuitboard contains electronic components permanently electrically connected to printed circuits provided on said circuitboard.

* * * * *